US007314818B2

(12) United States Patent
Takahashi et al.

(10) Patent No.: US 7,314,818 B2
(45) Date of Patent: Jan. 1, 2008

(54) SEMICONDUCTOR DEVICE AND METHOD OF MANUFACTURING THE SAME, CIRCUIT BOARD, AND ELECTRONIC EQUIPMENT

(75) Inventors: Takuya Takahashi, Sakata (JP); Hiroyuki Tomimatsu, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/410,129

(22) Filed: Apr. 25, 2006

(65) Prior Publication Data

US 2006/0189117 A1 Aug. 24, 2006

Related U.S. Application Data

(62) Division of application No. 10/347,299, filed on Jan. 21, 2003, now Pat. No. 7,064,425.

(30) Foreign Application Priority Data

Feb. 19, 2002 (JP) .............................. 2002-41680

(51) Int. Cl.
*H01L 21/44* (2006.01)

(52) U.S. Cl. ...................... 438/612; 438/617; 438/666; 257/E21.508

(58) Field of Classification Search ................ 257/685, 257/686, 723, 777, 780, 784, 786, E21.508, 257/E21.509, E21.519; 438/109, 107, 110, 438/617, 612–613, 666, 614, 618
See application file for complete search history.

(56) References Cited

U.S. PATENT DOCUMENTS 4,845,543 A 7/1989 Okikawa et al.
5,842,628 A * 12/1998 Nomoto et al. .......... 228/180.5
6,215,182 B1 4/2001 Ozawa et al.
6,559,526 B2 5/2003 Lee et al.
6,727,574 B2 4/2004 Tominatsu
6,921,016 B2 7/2005 Takahashi
6,946,380 B2 9/2005 Takahashi

FOREIGN PATENT DOCUMENTS

JP A 8-340018 12/1996
JP A 10-112471 4/1998
JP A 2001-118877 4/2001
JP A 2001-127246 5/2001
JP A 2001-284388 10/2001
JP A 2002-110898 4/2002
JP A 2002-280410 9/2002

* cited by examiner

*Primary Examiner*—Hoai v Pham
*Assistant Examiner*—DiLinh Nguyen
(74) *Attorney, Agent, or Firm*—Oliff & Berridge, PLC

(57) ABSTRACT

A tip of a first wire is bonded to a first electrode. The first wire is drawn from the first electrode to a bump on a second electrode. A part of the first wire is deformed and bonded to the bump. A tip of a second wire formed in the shape of a ball is bonded to the bump by using a tool in a state in which at least a part of the tip is superposed on the first wire. A part of the first wire which is not deformed by bonding is prevented from being deformed by the tip of the second wire and the tool.

22 Claims, 14 Drawing Sheets

SEMICONDUCTOR DEVICE AND METHOD OF MANUFACTURING THE SAME, CIRCUIT BOARD, AND ELECTRONIC EQUIPMENT

This is a Divisional of application Ser. No. 10/347,299, filed Jan. 21, 2003 now U.S. Pat. No. 7,064,425, which claims priority from Japanese Patent Application No. 2002-41680, filed Feb. 19, 2002. The entire disclosures of the prior applications are hereby incorporated by reference in their entirety.

BACKGROUND OF THE INVENTION

The present invention relates to a semiconductor device and a method of manufacturing the same, a circuit board, and electronic equipment.

In the manufacture of semiconductor devices, a method of bonding a plurality of wires in layers to a bump on an electrode is known. According to this method, a small semiconductor device can be manufactured without uselessly increasing the size of the bump. In the case of bonding the wires in layers, it is important not to cause connection failure between the wire on the lower side and the bump in a bonding step of the wire on the upper side.

BRIEF SUMMARY OF THE INVENTION

A method of manufacturing a semiconductor device according to an aspect of the present invention includes steps of:

(a) bonding a first tip of a first wire to a first electrode;

(b) drawing the first wire from the first electrode to a bump of a second electrode;

(c) bonding a part of the first wire to the bump by deforming the part of the first wire; and (d) bonding a second tip of a second wire formed in a shape of a ball to the bump by using a tool in a state in which at least a part of the second tip of the second wire is superposed on the first wire, wherein the bonding step is performed without causing a deformation to a part of the first wire that is not deformed: by bonding by the second tip of the second wire and the tool in the step (d).

A semiconductor device according to another aspect of the present invention is manufactured by using the above method.

A semiconductor device according to a further aspect of the present invention includes:

a lead having a part which becomes a first electrode;

a semiconductor chip which includes an integrated circuit, a second electrode, and a bump formed on the second electrode;

another semiconductor chip which includes an integrated circuit and a third electrode;

a first wire having one end electrically connected with the first electrode, and another end electrically connected with the bump; and a second wire having one end electrically connected with the bump in a state in which at least a part of the first end is superposed on the first wire, and another end electrically connected with the third electrode, wherein the center of the first end of the second wire is disposed on a portion of the bump beyond the center of the bump in a drawing direction of the first wire.

A semiconductor device according to a still further aspect of the present invention includes:

a first semiconductor chip which includes an integrated circuit and a first electrode;

a second semiconductor chip which includes an integrated circuit, a second electrode, and a bump formed on the second electrode;

a third semiconductor chip which includes an integrated circuit and a third electrode;

a lead which is electrically connected with one of the first to third semiconductor chips;

a first wire having one end electrically connected with the first electrode, and another end electrically connected with the bump; and a second wire having one end electrically connected with the bump in a state in which at least a part of the first end is superposed on the first wire, and another end electrically connected with the third electrode, wherein the center of the first end of the second wire is disposed on a portion of the bump beyond the center of the bump in a drawing direction of the first wire.

A circuit board according to an even further aspect of the present invention has the above semiconductor device mounted thereon.

Electronic equipment according to a yet further aspect of the present invention includes the above semiconductor device.

DETAILED DESCRIPTION OF THE EMBODIMENT

Figure 1A:
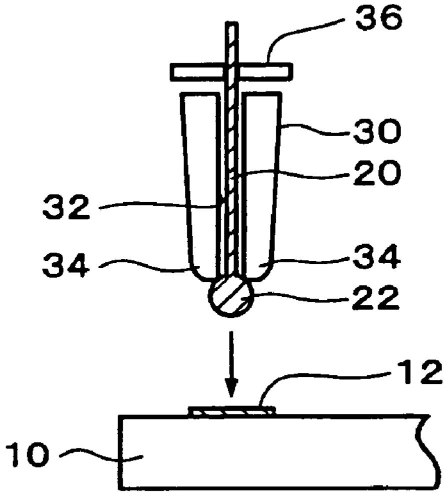
FIGS. 1A to 1C illustrate a method for forming a bump and a method of manufacturing a semiconductor element having bumps according to a first embodiment of the present invention.

An embodiment of the present invention may bond a plurality of wires to a bump in a reliable and stable state.

(1) A method of manufacturing a semiconductor device according to an embodiment of the present invention includes steps of:

(a) bonding a first tip of a first wire to a first electrode;

(b) drawing the first wire from the first electrode to a bump on a second electrode;

(c) bonding a part of the first wire to the bump by deforming the part of the first wire; and (d) bonding a second tip of a second wire formed in a shape of a ball to the bump by using a tool in a state in which at least a part of the second tip of the second wire is superposed on the first wire, wherein the bonding step is performed without causing a deformation to a part of the first wire that is not deformed by bonding by the second tip of the second wire and the tool in the step (d).

According to this embodiment of the present invention, since the bonding step is performed without causing the undeformed part of the first wire to be deformed by the second tip of the second wire and the tool, the second wire can be bonded to the bump without causing connection failure between the first wire and the bump. Therefore, a plurality of wires can be bonded to the bump in a reliable and stable state.

(2) In this method of manufacturing a semiconductor device, the bonding step may be performed in a state in which a center of the second tip of the second wire-is disposed on a portion of the bump beyond the center of the bump along a drawing direction of the first wire in the step (d).

Therefore, if the width of the bump is elongated in the drawing direction of the first wire, for example, a junction region between the bump and the second wire can be secured sufficiently. Moreover, if the height of the bump decreases along the drawing direction of the first wire, for example, the second tip of the second wire can be easily placed on the bump. Therefore, the second tip of the second wire can be bonded to the bump in a reliable and stable state.

(3) In this method of manufacturing a semiconductor device, the bonding step may be performed without causing the second tip of the second wire and the tool to come in contact with a portion of the first wire excluding a portion that is deformed so that a diameter of the first wire is decreased to about half or less in the step (d).

This prevents connection failure between the first wire and the bump-more reliably.

(4) In this method of manufacturing a semiconductor device, the bonding step may be performed without causing the second tip of the second wire and the tool to come in contact with a portion of the first wire excluding a portion that is deformed so that a diameter of the first wire is decreased to about half or less in the step (d).

This prevents connection failure between the first wire and the bump still more reliably.

(5) This method of manufacturing a semiconductor device may further include a step of forming another bump on a third electrode, and the second wire may be drawn from the second electrode to the bump on the third electrode and bonded to the bump on the third electrode after the step (d).

(6) In this method of manufacturing a semiconductor device, the tool may have a hole into which the second wire-is inserted, and the bonding step may be performed by using an open end of the tool in the step (d).

(7) In this method of manufacturing a semiconductor device, a part of the first wire may be bonded to a center of the bump or a portion of the bump beyond the center along a drawing direction of the first wire in the step (c).

This prevents a part of the first wire which projects from the bump toward the first electrode from being pressed, for example. Therefore, the first wire can be prevented from sagging.

(8) In this method of manufacturing a semiconductor device, a part of the bump may be deformed in the step (c).

This enables the first wire to be drawn up in the direction opposite to the second electrode (upward direction) by using an undeformed part of the bump as a fulcrum. Therefore, the first wire can be prevented from coming in contact with a member on which the second electrode is formed.

(9) In this method of manufacturing a semiconductor device, the bump may be formed so that the width of the bump is elongated in a drawing direction of the first wire in the step (c).

This enables the second wire to be easily bonded to the bump.

(10) In this method of manufacturing a semiconductor device, the bump may be formed so that a height of the bump decreases as a distance from the first wire increases in a drawing direction of the first wire in the step (c).

This enables the second wire to be easily bonded to the bump.

(11) In this method of manufacturing a semiconductor device, the tool may have a hole into which the second wire is inserted, and the bonding step may be performed by using an open end of the tool in the step (d)

(12) This method of manufacturing a semiconductor device may further include, before the step (a), steps of:

(e) bonding a third tip of a third wire formed in a shape of a ball to the second electrode;

(f) drawing a part of the third wire from the third tip bonded to the second electrode;

(g) forming the bump on the second electrode by deforming a portion of the third wire continuous with the third tip of the third wire on third the tip, and (h) cutting the third wire while leaving the bump on the second electrode.

According to this feature, a bump having an almost smooth surface can be easily formed on the electrode.

(13) In this method of manufacturing a semiconductor device, the bump may be formed to have a bottom end connected with the second electrode and a top end having an almost smooth surface in the step (g).

(14) In this method of manufacturing a semiconductor device, the top end of the bump may be formed so that a width of the top end is elongated in a drawing direction of the first wire connected with the bump toward the bump in the step (g).

This enables the first wire to be easily bonded to the top end of the bump.

(15) In this method of manufacturing a semiconductor device, the top end of the bump may be formed so that a height of the top end decreases as a distance from the first wire increases in a drawing direction of the first wire in the step (g).

This enables the first wire to be easily bonded to the top end of the bump.

(16) A semiconductor device according to another embodiment of the present invention is manufactured by the above method.

(17) A semiconductor device according to a further embodiment of the present invention includes:

a lead having a part which becomes a first electrode;

a semiconductor chip which includes an integrated circuit, a second electrode, and a bump formed on the second electrode;

another semiconductor chip which includes an integrated circuit and a third electrode;

a first wire having one end electrically connected with the first electrode, and another end electrically connected with the bump; and a second wire having one end electrically connected with the bump in a state in which at least a part of the first end is superposed on the first wire, and another end electrically connected with the third electrode, wherein the center of the first end of the second wire is disposed on a portion of the bump beyond the center of the bump in a drawing direction of the first wire.

According to this embodiment of the present embodiment, the second wire can be bonded to the bump without causing connection failure between the first wire and the bump. Moreover, if the width of the bump is elongated in the drawing direction of the first wire, for example, a junction region between the bump and the second wire can be secured sufficiently. Furthermore, if the height of the bump decreases in the drawing direction of the first wire, for example, the second tip of the second wire can be easily placed on the bump. Therefore, a plurality of wires can be bonded to the bump in a reliable and stable state.

(18) A semiconductor device according to a still further embodiment of the present invention includes:

a first semiconductor chip which includes an integrated circuit and a first electrode;

a second semiconductor chip which includes an integrated circuit, a second electrode, and a bump formed on the second electrode;

a third semiconductor chip which includes an integrated circuit and a third electrode;

a lead which is electrically connected with one of the first to third semiconductor chips;

a first wire having one end electrically connected-with the first electrode, and another end electrically connected with the bump; and a second wire having one end electrically connected with the bump in a state in which at least a part of the first end is superposed on the first wire, and another end electrically connected with the third electrode, wherein the center of the first end of the second wire is disposed on a portion of the bump beyond the center of the bump in a drawing direction of the first wire.

According to this embodiment of the present embodiment, the second wire can be bonded to the bump without causing connection failure between the first wire and the bump. Moreover, if the width of the bump is elongated in the drawing direction of the first wire, for example, a junction region between the bump and the second wire can be secured sufficiently. Furthermore, if the height of the bump decreases in the drawing direction of the first wire, for example, the second tip of the second wire can be easily placed on the bump. Therefore, a plurality of wires can be bonded to the bump in a reliable and stable state.

(19) In this semiconductor device, the other end-of the first wire may be bonded to a center of the bump or a portion of the bump beyond the center along a drawing direction of the first wire.

According to this feature, since the other end of the first wire is connected with the center of the bump or a portion of the bump beyond the center in the drawing direction of the wire, a part of the first wire which projects from the bump toward the first electrode can be prevented from sagging.

(20) In this semiconductor device, a part of the bump may be deformed.

This enables the first wire to be drawn up in the direction opposite to the electrode (upward direction) by using an undeformed part of the bump as a fulcrum. Therefore, the first wire can be prevented from coming in contact with the semiconductor chip.

(21) In this semiconductor device, the bump may have a bottom end connected with the second electrode and a top end having an almost smooth surface, and at least the top end of the bump may be formed so that a width of the top end is elongated in a drawing direction of the first wire.

According to this feature, since the wire is easily bonded to the top end of the bump, reliability of electrical connection between the wire and the bump is increased.

(22) In this semiconductor device, the bump may have a bottom end connected with the second electrode and a top end having an almost smooth surface, and the top end of the bump may be formed so that a height of the top end decreases as a distance from the first wire increases in a drawing direction of the first wire.

According to this feature, since the wire is easily bonded to the top end of the bump, reliability of electrical connection between the wire and the bump is increased.

(23) A circuit board according to an even further embodiment of the present invention has the above semiconductor device mounted on the circuit board.

(24) Electronic equipment according to a yet further embodiment of the present invention includes the above semiconductor device.

The embodiments of the present invention are described below with reference to the drawings. However, the present invention is not limited to these embodiments.

First Embodiment

FIGS. 1A to 1C, FIGS. 2A and 2B, and FIGS. 3 to 8 illustrate a semiconductor element having bumps and a method of manufacturing the same according to the present embodiment. In the present embodiment, a bump 40 is formed on an electrode 12 of a semiconductor element 10. The bump 40 is formed by bonding a wire 20 to the electrode 12 by using a tool 30. The bump 40 is used as a terminal for wire bonding.

The method of manufacturing a semiconductor element having bumps of the present embodiment includes a method for forming a bump shown in FIGS. 1A to 2B.

As shown in FIG. 1A, the semiconductor element 10 is provided. The semiconductor element 10 may be either a semiconductor wafer 14 (see FIG. 5) or a semiconductor chip 16 (see FIG. 6). Specifically, a bump formation process may be performed collectively in a wafer state or separately in a chip state. The semiconductor element 10 includes an integrated circuit. The semiconductor element 10 is generally formed in the shape of a rectangular parallelepiped (including a cube or a plate), for example. The integrated circuit is generally formed on one side (largest side, for example) of the semiconductor element 10.

The semiconductor element 10 has one or more electrodes 12. The electrode 12 is a pad thinly and smoothly formed on the side of the semiconductor element 10. The electrode 12 is formed on the side of the semiconductor element 10 on which the integrated circuit is formed. In this case, the electrode 12 may be formed outside the integrated circuit region. In the case of using the semiconductor chip 16, the electrode 12 is generally formed on the edge portion of the side (edge portions of two sides or four sides of the external shape, for example) of the semiconductor chip 16. In the case of using the semiconductor wafer 14, the electrode 12 is generally formed on the edge portion of a region 15 (edge portions of two sides or four sides of the region, for example) (see FIG. 5) including one integrated circuit of the semiconductor wafer 14. The electrode 12 is formed of an aluminum-based metal or a copper-based metal.

A passivation film (not shown) is formed on the semiconductor element 10 so as to avoid at least a part of each electrode 12. The passivation film may be formed of $SiO_2$, SiN, or a polyimide resin, for example.

As shown in FIG. 1A, the tool 30 which supports the wire 20 is provided. The wire 20 is formed of a conductive material such as gold. The tool 30 supports the wire 20 so that the axial direction of the wire 20 is perpendicular to the side of the electrode 12. In the example shown in FIG. 1A, the tool 30 has a hole 32. The wire 20 is inserted into the hole 32. The width (diameter) of the hole 32 is greater than the width (diameter) of the wire 20. Therefore, the wire 20 can be fed in the axial direction of the hole 32. The tool 30 may be a capillary used in the manufacture of a semiconductor device. The tool 30 may support the wire 20 by a guide means other than the hole. The tool 30 is supported on a main body (wire bonder) of a manufacturing apparatus (not shown) by means of a support (ultrasonic horn, for example) (not shown).

The wire 20 is held by a clamper 36. The clamper 36 is disposed above the tool 30, specifically, on the side opposite to the electrode 12. The wire 20 can be held by closing the clamper 36. The wire 20 can be handled by the tool 30 by opening the clamper 36. In the example shown in FIG. 1A, the tool 30 and the clamper 36 are formed separately. However, the tool 30 and the clamper 36 may be formed integrally. For example, the tool 30 may have a function of the clamper 36.

A tip 22 of the wire 20 projects outside the opening of the hole 32 on the side of the electrode 12. An open end (or pressing section) 34 of the hole 32 is capable of pressing a part of the wire 20 (see FIGS. 1B, 2A, and 2B). A part (near the periphery of the tool) of the open end 34 may be sloped, as shown in the FIG. 1A. The open end 34 maybe a smooth surface.

As shown in FIG. 1A, the tool 30 is disposed on the side of the electrode 12 (above the electrode 12) of the semiconductor element 10. The tip 22 of the wire 20 is formed in the shape of a ball (or in the shape of a lump). The tip 22 may be formed in the shape of a ball by melting the tip 22 by applying thermal energy (such as discharge or gas flame). For example, an electric torch (not shown) may be allowed to approach the tip 22, and the tip 22 may be melted by high voltage discharge from the electric torch.

Figure 1B:
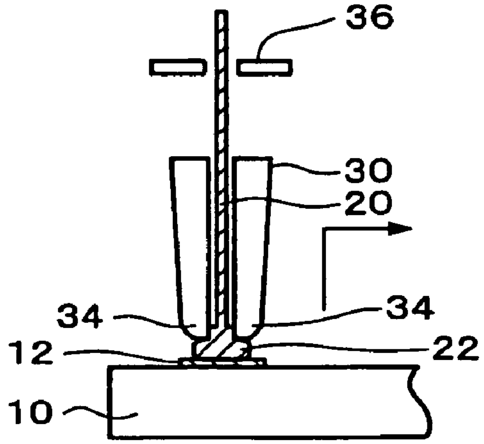

As shown in FIG. 1B, the tip 22 of the wire 20 is disposed above one of the electrodes 12. The tool 30 is brought down in a state in which the damper 36 is opened. The tip 22 of the wire 20 is bonded to the electrode 12 in this manner. In more detail, the tip 22 of the wire 20 is pressed by the open end 34 of the tool 30. It is preferable to apply ultrasonic vibration, heat, or the like while pressing the tip 22. This enables the tip 22 to be joined to the electrode 12 in a good state. A top end and a bottom end larger (wider) than the top end are formed at the tip 22 of the wire 20 by the pressure applied by the open end 34.

Figure 1C:
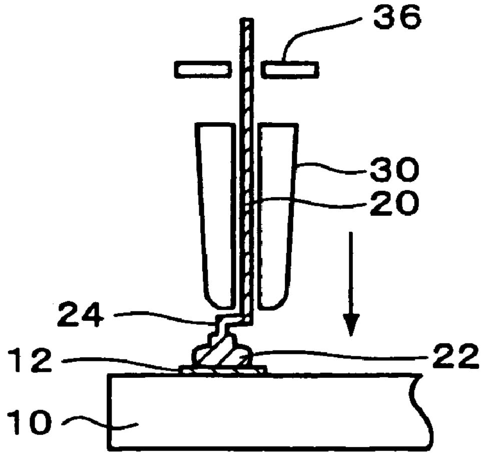

As shown in FIG. 1C, a part 24 of the wire 20 is drawn from the tip 22 bonded to the electrode 12. Since the tip 22 is joined to the electrode 12, the part 24 of the wire 20 can be drawn from the tip 22 by moving the tool 30 in a direction so as to be apart from the electrode 12.

In the example shown in FIG. IC, the part 24 of the wire 20 is drawn from the tip 22 so that the part 24 is bent. This enables the wire 20 to be easily deformed at a portion continuous with the tip 22, on the tip 22. For example, the part 24 of the wire 20 maybe bent by drawing the wire 20 above the electrode 12 by moving the tool 30 in a height direction of the tip 22, and then moving the tool 30 in a width direction of the tip 22. The form (shape, method, for example) of bending the part 24 of the wire 20 is not limited to the above-described example.

Figure 2A:
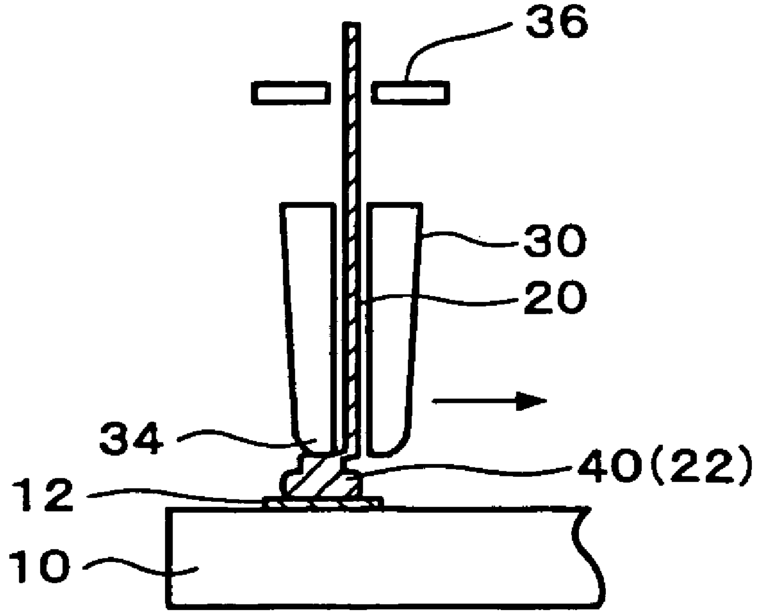
FIGS. 2A and 2B illustrate the method for forming a bump and the method of manufacturing a semiconductor element having bumps according to the first embodiment of the present invention.

As shown in FIG. 2A, a portion of the wire 20 continuous with the tip 22 is deformed by the tool 30. In more detail, at least a portion (part 24) continuous with the tip 22 of the wire 20 drawn from the tip 22 is deformed. As shown in FIG. 2A, the wire 20 may be deformed by a part of the open end 34 on one side of the hole 32 (part on the side opposite to the side to which the tool 30 is moved). On the tip 22, the wire 20 is deformed at a portion continuous with the tip 22, and becomes smooth. It is preferable to apply ultrasonic vibration when deforming a portion of the wire 20. Ultrasonic vibration is applied to the tip 22 through the tool 30. The bump 40 is formed on the electrode 12 in this manner. The bump 40 has a bottom end 44 connected with the electrode 12, and a top end 42 having an almost smooth surface (surface on which the projection of the wire is deformed) (see FIG. 4).

Figure 3:
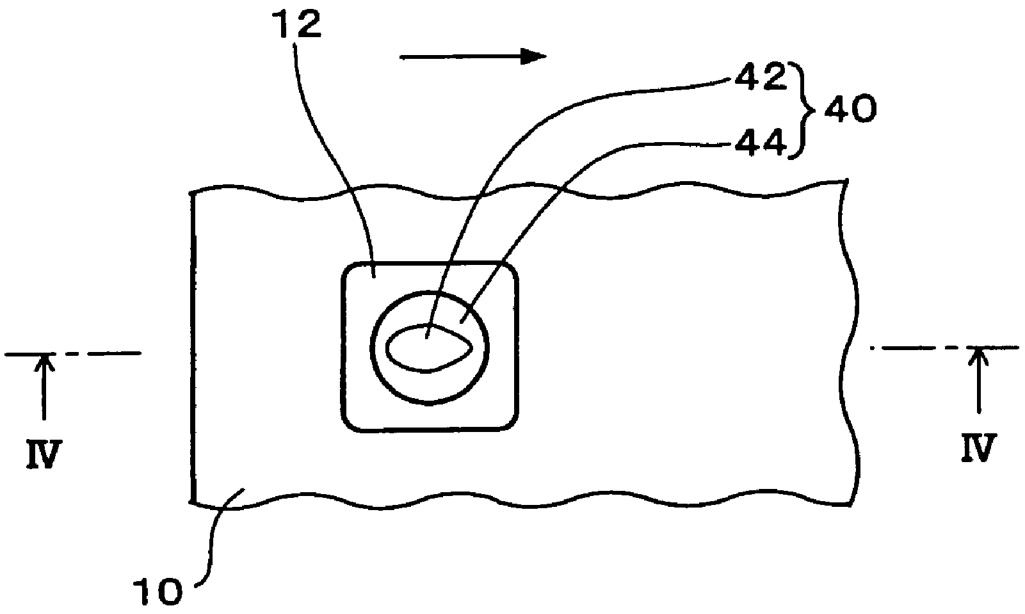
FIG. 3 illustrates a semiconductor element having bumps and a method of manufacturing the same according to the first embodiment of the present invention.
Figure 4:
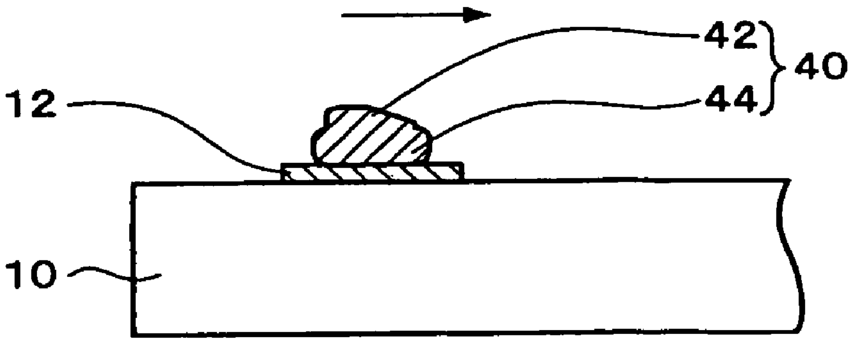
FIG. 4 is across-sectional view along the line VI-VI shown in FIG. 3.

In the example shown in FIG. 2A, the tool 30 is moved on the tip 22 in the width direction of the tip 22 (direction indicated by an arrow shown in FIG. 2A) while applying pressure to the tip 22. In other words, the tool 30 is slid in the direction parallel to the surface of the semiconductor element 10 while applying pressure to the tip 22. The bump 40 is formed in an optimum shape in this manner, as shown in FIGS. 3 and 4. FIG. 3 is a plan view of the semiconductor element after formation of the bump. FIG. 4 is a cross-sectional view along the line VI-VI shown in FIG. 3.

In the step of moving the tool 30 in the width direction of the tip 22 (direction indicated by the arrow shown in FIGS. 3 and 4), the width (length) of the top end 42 of the bump 40 may be elongated in the moving direction of the tool 30. In other words, the top end 42 of the bump 40 may be formed almost in the shape of an oval in a plan view of the bump 40.

Figure 7:
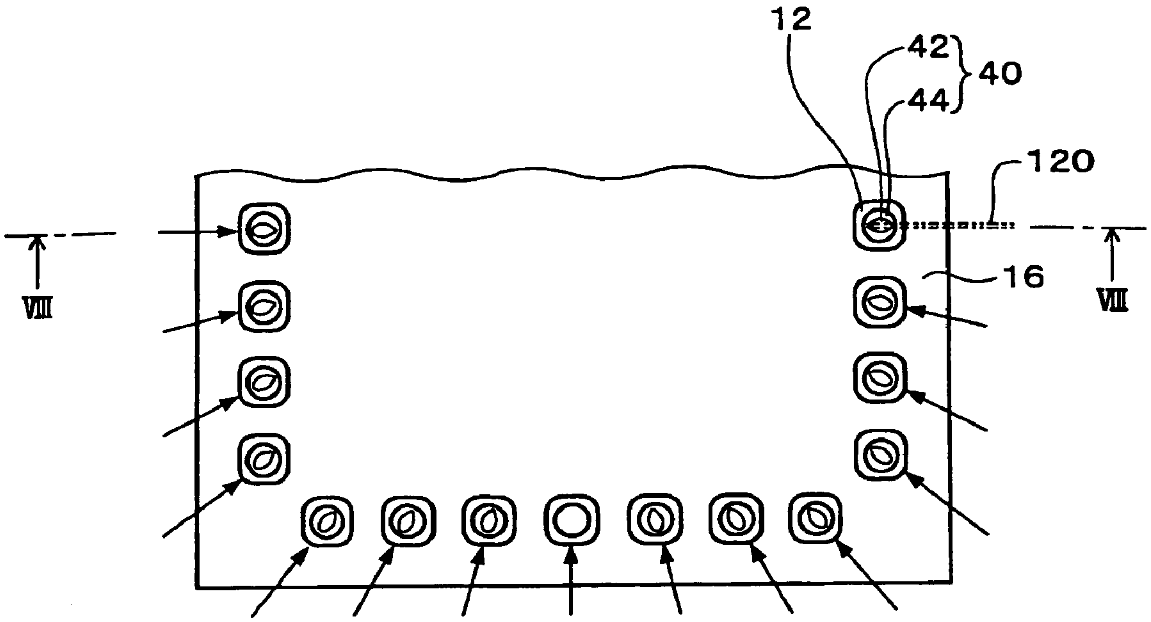
FIG. 7 further illustrates the semiconductor element having bumps and the method of manufacturing the same according to the first embodiment of the present invention.
Figure 8:
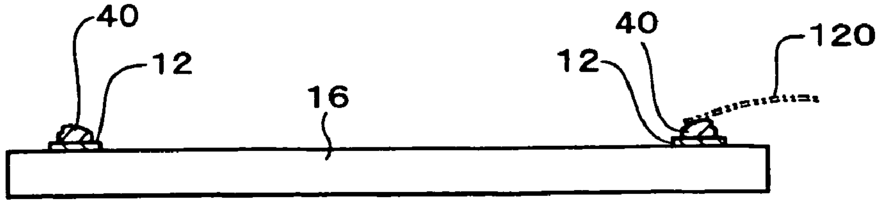
FIG. 8 is a cross-sectional view along the line VIII-VIII shown in FIG. 7.

This enables another wire 120 to be easily bonded to the top end 42 of the bump 40 in a subsequent step (see FIGS. 7 and 8). In more detail, a junction region between the wire 120 and the bump 40 can be secured sufficiently by drawing the wire 120 in the direction in which the width of the bump 40 is elongated. Therefore, the wire 120 can be bonded to the bump 40 in a reliable and stable state.

In the step of moving the tool 30 in the width direction of the tip 22 (direction indicated by the arrow shown in FIGS. 3 and 4), the height of the top end 42 of the bump 40 may be decreased along the moving direction of the tool 30. In other words, the bump 40 may be sloped so that the height of the bump 40 decreases along the moving direction of the tool 30.

This enables another wire 120 to be easily bonded to the top end 42 of the bump 40 in a subsequent step (see FIGS. 7 and 8). In more detail, the distance between the wire 120 and the semiconductor element 10 can be increased by drawing the wire 120 toward the bump 40 so as to descend from the higher side of the bump 40. Therefore, the wire 120 can be prevented from coming in contact with the semiconductor element 10. Moreover, since the wire 120 can be easily prevented from coming in contact with the semiconductor element 10, limitations to design such as the loop shape-and loop height of the wire 120 and the distance between the electrode 12 and the corner (edge) of the semiconductor chip 16 are eliminated, whereby the degree of freedom relating to the design (decrease in height and length of loop of the wire, for example) can be increased.

FIGS. 7 and 8 illustrate the moving direction of the tool 30 (direction of the width of the tip 22). In more detail, FIG. 7 is a plan view of the semiconductor chip after formation of the bump. FIG. 8 is a cross-sectional view along the line VIII-VIII shown in FIG. 7. Each direction indicated by an arrow shown in FIG. 7 indicates a drawing direction of the wire 120 to be connected in a subsequent step toward the bump 40. The wire 120 electrically connects the electrode 12 of the semiconductor chip 16 with another electronic component (interconnect of a substrate or another semiconductor chip, for example).

As shown in FIG. 7, the tool 30 may be moved in the drawing direction of the wire 120 to be connected with the bump 40 toward the bump 40. The drawing direction of the wire 120 is not limited to the direction indicated by the arrow shown in FIG. 7. The direction may be arbitrarily determined depending on the position of the bump 40 (or electrode 12).

In the case where two or more electrodes 12 are formed on the edge portion (edge portions of four sides of the external shape in FIG. 7) of the semiconductor chip 16, the tool 30 may be moved in the direction from the edge portion of the semiconductor chip 16 toward the center portion of the semiconductor chip 16. In the case where two or more electrodes 12 are formed on the edge portion of the semiconductor chip 16 as shown in FIG. 7, the wire 120 is generally drawn from the edge portion of the semiconductor chip 16 toward the center portion of the semiconductor chip 16. For example, two or more of a plurality of the wires 120 are drawn toward the bumps 40 so as to extend in directions which converge at one point (not shown) at the center portion of the semiconductor chip 16.

This enables the width (length) of the top end 42 of the bump 40 to be elongated in the drawing direction of the wire 120, as shown in FIGS. 7 and 8. Moreover, the top end 42 of the bump 40 can be formed so that the height (thickness) of the top end 42 decreases along the drawing direction of the wire 120, as shown in FIG. 8. Specifically, the height of the bump 40 on the side close to the edge of the semiconductor chip 16 can be made greater than that on the side close to the center portion of the semiconductor chip 16. The effects of these features are the same as described above.

Figure 5:
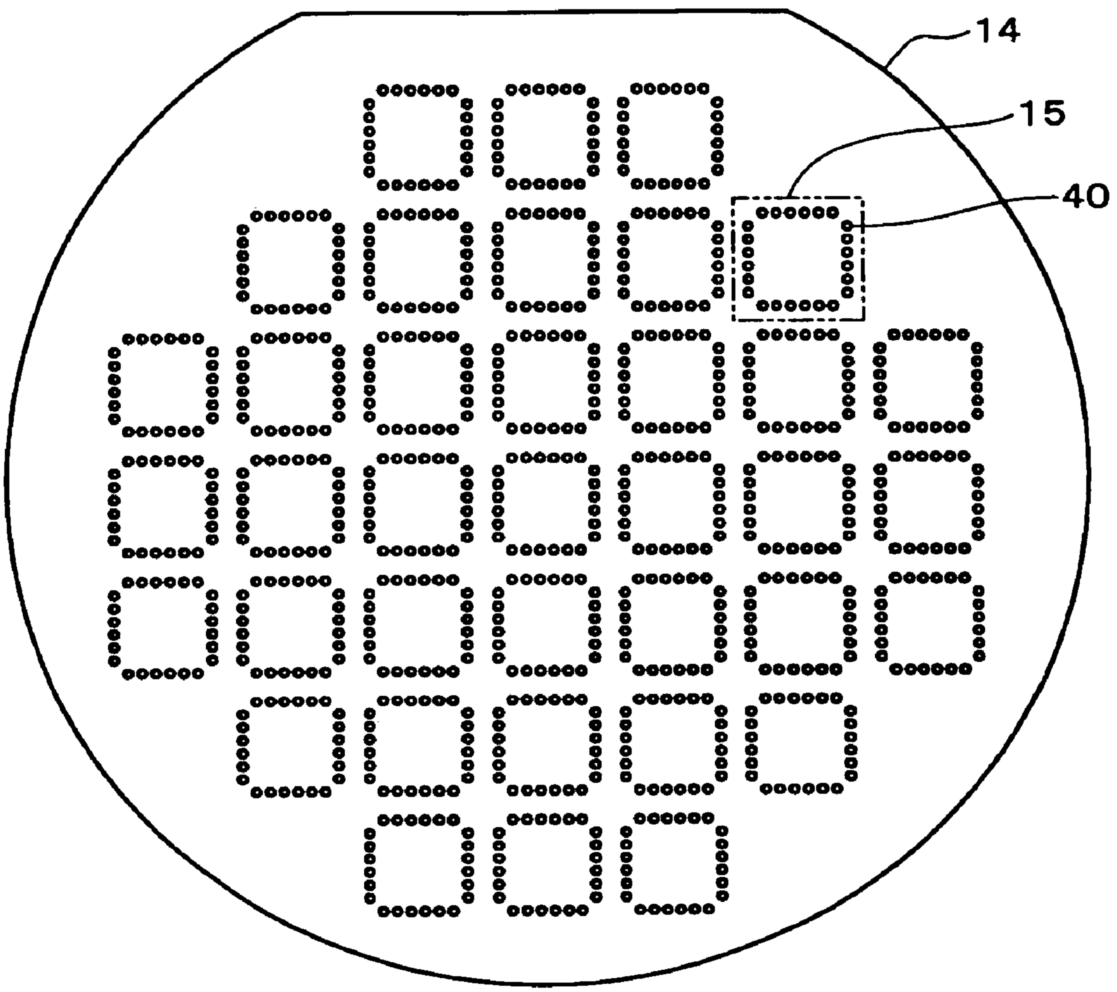
FIG. 5 illustrates the semiconductor element having bumps and the method of manufacturing the same according to the first embodiment of the present invention.
Figure 6:
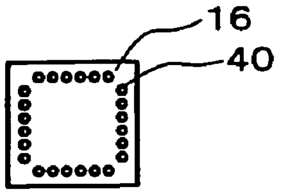
FIG. 6 further illustrates the semiconductor element having bumps and the method of manufacturing the same according to the first embodiment of the present invention.

The above description of the moving direction of the tool 30 may be applied not only to the semiconductor chip 16, but also to the semiconductor wafer 14. In more detail, the above description of the moving direction of the tool 30 may be applied to the case where the semiconductor chip 16 is replaced with the region 15 of the semiconductor wafer 14 including one of the integrated circuits, as shown in FIGS. 5 and 6.

Figure 2B:
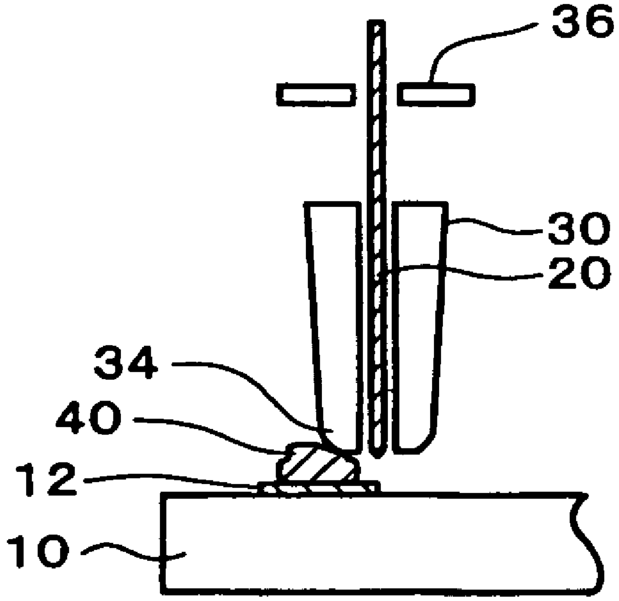

In the example shown in FIGS. 2A and 2B, the wire 20 is thinly stretched and cut by moving the tool 30 in the width direction of the tip 22. In this case, the tool 30 allows a part of the wire 20 inserted into the hole 32 in the tool 30 to be moved in the direction so as to be apart from the tip 22 (direction indicated by the arrow shown in FIG. 2A). This enables the top end 42 of the bump 40 to be formed in an optimum shape and the wire 20 to be cut at the same time. Moreover, the wire 20 can be cut at a specific position by moving the tool 30 in the width direction of the tip 22 while applying ultrasonic vibration. Specifically, in the case of forming a plurality of bumps, the wire 20 can be cut at a uniform position each time the bump is formed. Therefore, the length of a part of the wire 20 which projects outside the tool 30 can be made uniform, whereby the diameter of the ball-shaped tip 22 can be the same. Therefore, the continuous processing capability of the wire 20 is stabilized.

In the case where the semiconductor element 10 has a plurality of electrodes 12, the bump 40 is formed on each electrode 12 by repeating each of the above-described steps (steps shown in FIGS. 1A to 2B). Specifically, the tip of the wire 20 which projects outside the tool 30 shown in FIG. 2B is formed in the shape of a ball as shown in FIG. 1A, and bonded to another electrode of the semiconductor element 10.

The above example illustrates a case where the bump is formed on the electrode 12 of the semiconductor element 10. However, the form of the electrode is not limited in the method for forming a bump of the present embodiment. For example, the bump may be formed on a part of a lead (an interconnect of a substrate or an inner lead of a lead frame).

According to the method of manufacturing a semiconductor element having bumps of the present embodiment, the bump 40 having an almost smooth surface can be easily formed on the electrode 12. Moreover, since the bump 40 is formed on the electrode 12 and the surface of the bump 40 is smoothed by using the tool 30 at the time of bonding, the manufacturing steps are easy and quick. This eliminates the need to separately perform a step of smoothing the surface of the bump 40 (smoothing step, for example), for example.

Moreover, since the bump 40 can be formed in a shape optimum for wire bonding performed in a subsequent step, the position of the wire 120 on the bump 40 can be prevented from deviating or the wire 120 can be prevented from being bonded in a crooked state.

Any of the subjects (configuration, action, and effect) derived from the features described relating to the above manufacturing method may be selectively applied to the method for forming a bump according to the present embodiment.

FIGS. 3 to 8 illustrate a semiconductor element having bumps according to the present embodiment. This semiconductor element having bumps may be manufactured by using the above-described method. In the following description, subjects derived from the features of the above method are omitted.

The semiconductor element 10 may be either the semiconductor wafer 14 as shown in FIG. 5 or the semiconductor chip 16 as shown in FIG. 6.

The semiconductor element 10 includes the bump 40 provided on the electrode 12. The bump 40 has the bottom end 44 connected with the electrode 12, and the top end 42 having an almost smooth surface (surface on which the projection is deformed).

As shown in FIG. 3, the width of the top end 42 of the bump 40 is elongated in a specific direction in a plan view of the semiconductor element 10. In more detail, the width of the top end 42 of the bump 40 is elongated in the drawing direction of the wire 120 toward the bump 40, as shown in FIG. 7. In other words, the width of the top end 42 is elongated in the direction from the edge portion of the semiconductor chip 16 (or the region 15 of the semiconductor wafer 14 (see FIG. 5)) to the center portion of the semiconductor chip 16.

As shown in FIG. 4, the top end 42 of the bump 40 is sloped in a specific direction. A part of the top end 42 may be sloped as shown in FIG. 4, or the entire top end 42 may be sloped. At least a part of the top end 42 is an almost smooth surface. As shown in FIG. 8, the top end 42 is sloped so that the height of the top end 42 decreases along the drawing direction of the wire 120 toward the bump 40. In other words, the top end 42 is sloped so that the height of the top end 42 decreases along the direction from the edge portion of the semiconductor chip 16 (or the region 15 of the semiconductor wafer 14 (see FIG. 5)) to the center portion of the semiconductor chip 16.

According to the semiconductor element having bumps of the present embodiment, the wire (wire 120, for example) can be easily bonded to the top end 42 of the bump 40.

Second Embodiment

FIGS. 9 to 14 are views showing a semiconductor device and a method of manufacturing the same according to the present embodiment. In the present embodiment, second bonding of the wire 120 to the bump 40 is performed.

In the example given below, a semiconductor device is manufactured by using the semiconductor chip having bumps described in the above embodiment (including a semiconductor chip manufactured by using the above method). The semiconductor chip 16 may be formed by dividing the semiconductor wafer 14 having bumps into a plurality of individual pieces.

The features of the present embodiment may be applied to a semiconductor chip differing from the above embodiment (common semiconductor chip, for example).

Figure 9:
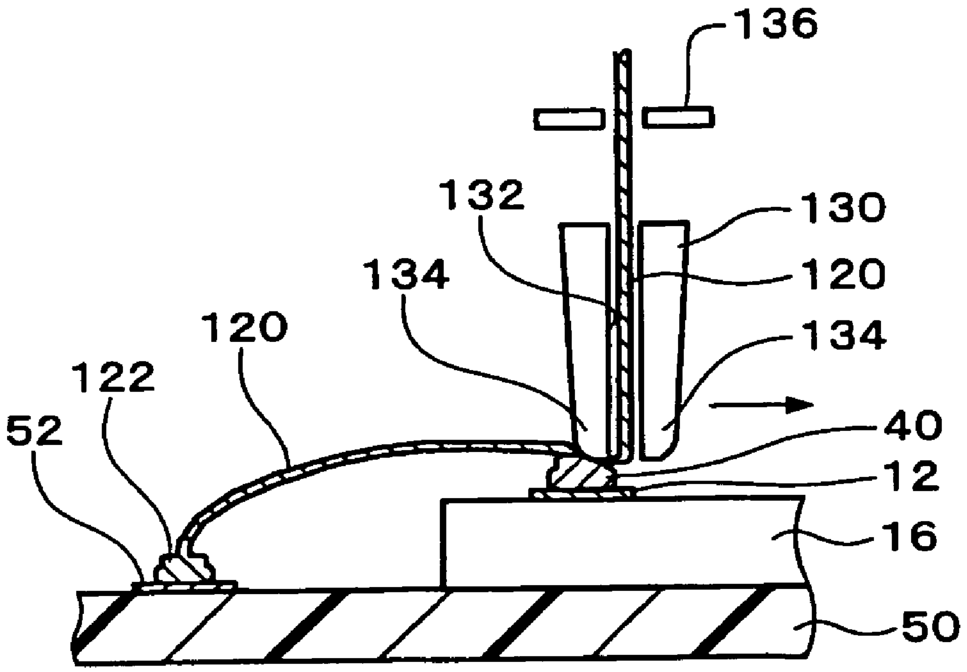
FIG. 9 illustrates a method of manufacturing a semiconductor device according to a second embodiment of the present invention.
Figure 10:
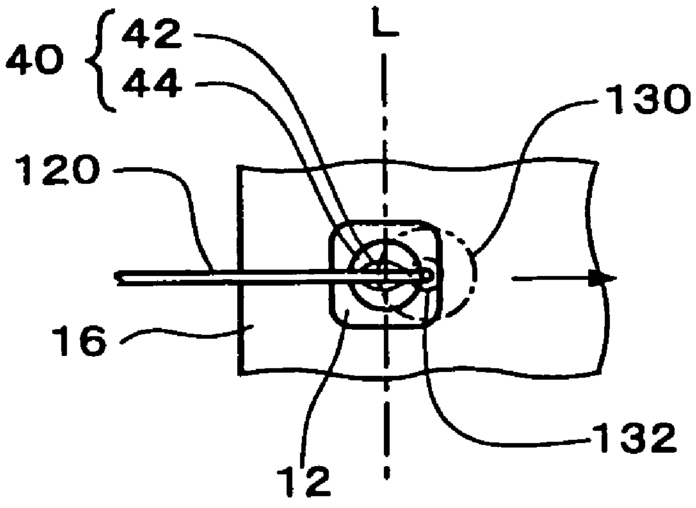
FIG. 10 further illustrates the method of manufacturing a semiconductor device according to the second embodiment of the present invention.
Figure 11:
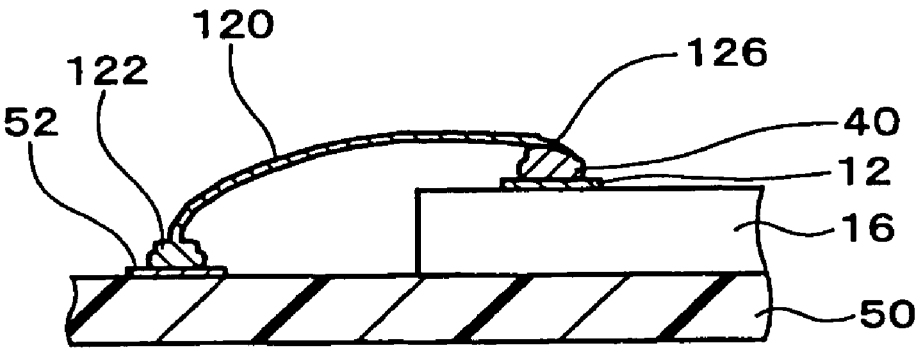
FIG. 11 further illustrates a semiconductor device and a method of manufacturing the same according to the second embodiment of the present invention.
Figure 12:
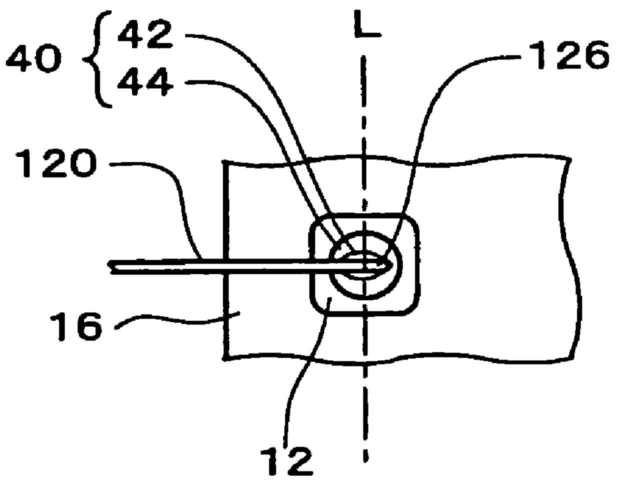
FIG. 12 further illustrates the semiconductor device and the method of manufacturing the same according to the second embodiment of the present invention.

FIGS. 9 to 12 illustrate a second bonding step of the wire. FIG. 10 is a partial plan view of a semiconductor chip shown in FIG. 9. FIG. 12 is a partial plan view of the semiconductor chip shown in FIG. 11. In FIG. 10, a tool is indicated by a two-dotted line.

As shown in FIG. 9, an electrode 52 is disposed outside the semiconductor chip 16. In the example shown in FIG. 9, the electrode 52 is a part of a lead (or interconnect) supported on a substrate 50. The electrode 52 may be a land. The semiconductor chip 16 is mounted on the substrate 50 so that the electrode 52 is disposed outside the semiconductor chip 16.

The substrate 50 may be formed of either an organic material (flexible substrate formed of a polyimide resin or the like) or an inorganic material (ceramic substrate or glass substrate). The substrate 50 may be formed of a composite structure (glass epoxy substrate) of these materials. The substrate 50 may be a single layer substrate or a multilayer substrate.

As a modification, the electrode 52 may be a part of a lead (inner lead, for example) supported on a lead frame of a plate material. In this case, the lead is not supported by a member and has a free end. The lead is made up of an inner lead and an outer lead. The lead is disposed so that the inner lead faces the electrode 12 of the semiconductor chip 16. The semiconductor chip 16 is mounted on a die pad (or heat sink) (not shown) so that the electrode 52 is disposed outside the semiconductor chip 16.

As shown in FIG. 9, a tool 130 which supports the wire 120 is provided. A tip 122 of the wire 120 is formed in the shape of a ball and bonded to the electrode 52 by using the tool 130. The wire 120, the tool 130, and the clamper 136 may be the same as described above. The tool 130 has a hole 132 and an open end 134. The method of forming the tip 122 of the wire 120 in the shape of a ball is the same as described above.

As shown in FIG. 9, after the tip 122 is bonded to the electrode 52, the wire 120 is drawn to the bump 40 on the electrode 12. In more detail, the wire 120 is drawn beyond a center line L of the bump 40, as shown in FIG. 10. As shown in FIG. 10, the center line L is a virtual line which passes through the center of the width of the bump 40 in the drawing direction of the wire 120, and intersects the drawing direction of the wire 120 at right angles.

A part of the wire 120 is bonded to the bump 40. In this case, the wire 120 is bonded to the bump 40 by using a part of the tool 130 (open end 134) on the side of the first electrode in the drawing direction of the wire 120. As shown in FIGS. 9 and 10, a part of the wire 120 may be bonded to the center (part which overlaps the center line L shown in FIG. 10) of the bump 40 in the drawing direction of the wire 120, or bonded to a part beyond the center (part on the right side of the center line L shown in FIG. 10). In the example shown in FIGS. 9 and 10, a region including the center of the bump 40 in the drawing direction of the wire 120 is pressed by the open end 134. As shown in FIGS. 9 and 10, the wire 120 may be bonded to the bump 40 in a part of the area in which the bump 40 overlaps the wire 120, or the wire 120 may be bonded to the bump 40 in the entire area in which the bump 40 overlaps the wire 120. In the former case, it is preferable not to press at least a part of the wire 120 which is not beyond the center of the bump 40 in the drawing direction of the wire 120 (part on the left side of the center line L shown in FIG. 10). This enables the wire 120 to be supported (drawn) by an area which remains undeformed without being pressed. Specifically, the wire 120 can be prevented from coming in contact with the semiconductor chip 16.

It is preferable to perform the bonding step of the wire 120 to the bump 40 while applying ultrasonic vibration. Ultrasonic vibration is applied to the bump 40 through the tool 130. This enables the wire 120 to be joined to the bump 40 in a good state.

In the example shown in FIG. 9, the tool 30 is moved on the bump 40 in a width direction of the bump 40 while applying pressure so that a part of the wire 120 is deformed. In other words, the tool 30 is slid in the direction parallel to the surface of the semiconductor chip 16 while applying pressure to the bump 40. In this case, the tool 30 may be moved in the drawing direction of the wire 120 toward the bump 40 (direction indicated by an arrow shown in FIG. 9 or 10).

The width (length) of the bump 40 (top end 42, in particular) is elongated in the drawing direction of the wire 120. This enables another wire 220 to be easily bonded to the bump 40 in a subsequent step (see FIG. 15A). In more detail, a junction region between the wire 220 and the bump 40 can be secured sufficiently, whereby the wire 220 can be bonded to the bump 40 in a reliable and stable state. Moreover, since the width of the bump 40 is elongated in the drawing direction of the wire 120, short-circuiting of the adjacent bumps 40 can be prevented. Furthermore, since the width of the bump 40 can be elongated in the moving direction of the tool 130, the width of the bump 40 can be elongated in an arbitrary direction other than the direction in which the bump 40 is spread by ultrasonic vibration.

The height (thickness) of the top end 42 of the bump 40 may be decreased along the drawing direction of the wire 120 toward the bump 40 by moving the tool 130.

Figure 15A:
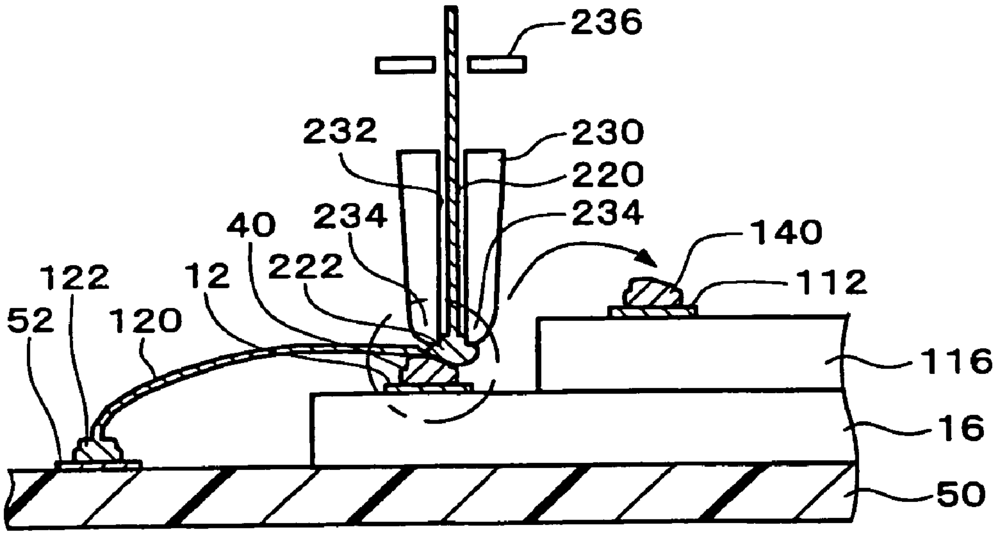
FIGS. 15A and 15B illustrate a semiconductor device and a method of manufacturing the same according to a third embodiment of the present invention.

This enables another wire 220 to be easily bonded to the bump 40 in a subsequent step (see FIG. 15A). In more detail, a tip 222 of the wire 220 formed in the shape of a ball can be easily bonded at a position shifted from the center of the bump 40.

In the example shown in FIGS. 9 and 11, the wire 20 is thinly stretched and cut by moving the tool 130 in a width direction of the tip 122. In this case, the tool 130 is moved so that a part of the wire 120 inserted into the hole 132 in the tool 130 is moved in the direction so as to be apart from the bump 40 (direction indicated by the arrow shown in FIG. 9). This enables the bump 40 to be formed in an optimum shape and the wire 120 to be cut at the same time. The wire 120 can be cut at a specific position by moving the tool 130 in the width direction of the bump 40 while applying ultrasonic vibration. Specifically, the wire 120 can be cut at a uniform position each time the wire 120 is bonded to each of a plurality of bumps 40. Therefore, the length of a part of the wire 120 which projects outside the tool 130 can be made uniform, whereby the diameter of the ball-shaped tip 122 can be the same. Therefore, the continuous processing capability of the wire 120 is stabilized.

A joint section 126 of the wire 120 is formed on the bump 40 in this manner, as shown in FIGS. 11 and 12. As shown in FIG. 11, the joint section 126 of the wire 120 is deformed so that the diameter of the joint section 126 is smaller than the diameter of the wire 120 before bonding. In the case where the semiconductor chip 16 has a plurality of bumps 40, a plurality of wires 120 are formed by repeating each of the above-described steps.

The above example illustrates a case where the electrode 52 (part of the lead) of the substrate 50 is electrically connected with the electrode 12 of the semiconductor chip 16 through the wire 120. However, the method of manufacturing a semiconductor device of the present embodiment is not limited to the above example. For example, the method may be applied to the case where the electrodes of a plurality of semiconductor chips are electrically connected through the wire 120.

According to the method of manufacturing a semiconductor device of the present embodiment, apart of the wire 120 is bonded to the center of the bump 40 or a part of the bump 40 beyond the center in the drawing direction of the wire 120. This enables a part of the wire 120 which projects from the bump 40 toward the electrode 52 in the drawing direction of the wire 120 to be prevented from being pressed by the tool 130, for example. This prevents the wire 120 from sagging. Therefore, the wire 120 can be bonded to the bump 40 in a reliable and stable state.

Moreover, since the width of the bump 40 is elongated in the drawing direction of the wire 120 and the height of the bump 40 decreases along the drawing direction of the wire 120, the wire 120 can be bonded in a more reliable and stable state.

Figure 13A:
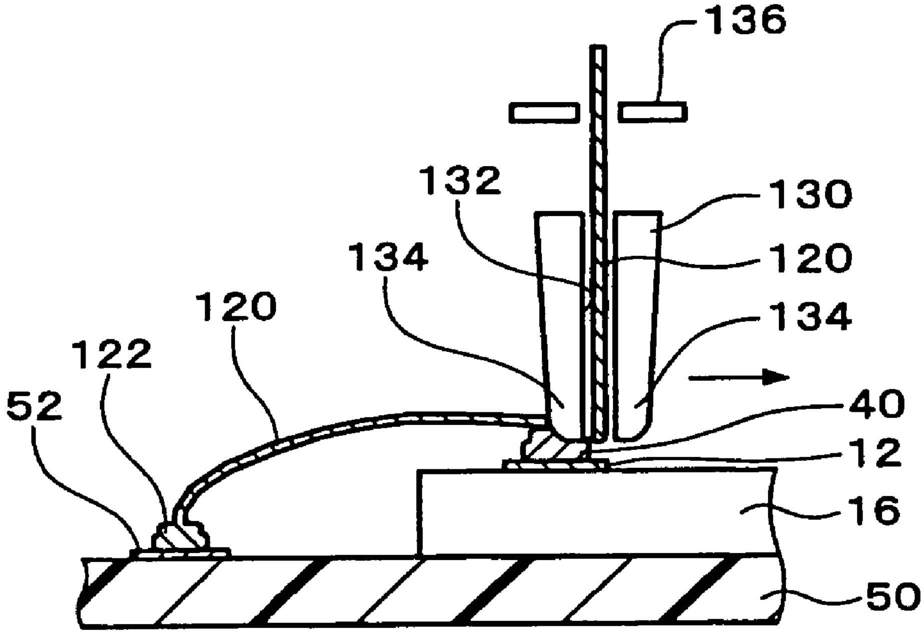
FIGS. 13A and 13B illustrates a semiconductor device and a method of manufacturing the same according to a modification of the second embodiment of the present invention.
Figure 13B:
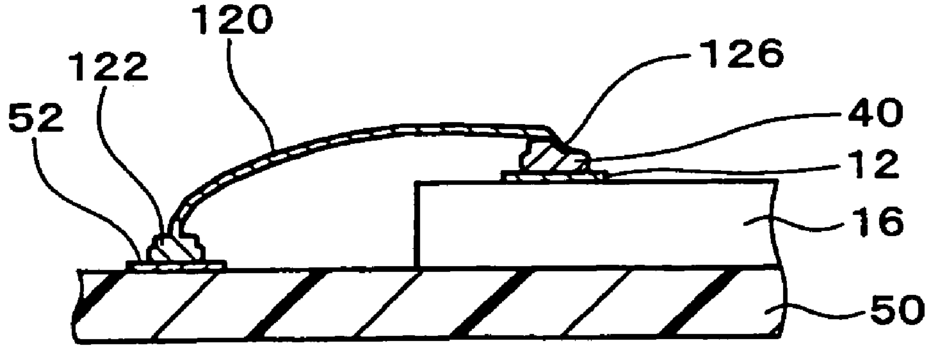

A modification of the present embodiment is described below. In this modification, a part of the bump 40 is deformed in the step of bonding a part of the wire 120 to the bump 40, as shown in FIGS. 13A and 13B. Specifically, a part of the bump 40 is plastically deformed by pressing the open end 134 of the tool 130 against the bump 40, as shown in FIG. 13A. In a plan view of the bump 40, a region of the bump 40 to be deformed overlaps a region in which the open end 134 comes in contact with the bump 40. The region of the bump 40 to be deformed may be the same as the bonding region of the wire 120 to the bump 40.

The tool 130 may be moved on the bump 40 in the width direction of the bump 40 (direction indicated by an arrow shown in FIG. 13A) while applying pressure so that a part of the bump 40 is deformed. The form of movement of the tool 130 and its effects are the same as described above.

As shown in FIG. 13B, a part of the bump 40 can be deformed in the joint section 126 between the wire 120 and the bump 40.

According to this modification, the wire 120 can be drawn up in the direction opposite to the semiconductor chip 16 (above the semiconductor chip 16) by using the undeformed portion of the bump 40 as a fulcrum. Specifically, the wire 120 can be prevented from coming in contact with the semiconductor chip 16.

Any of the subjects (configuration, action, and effect) derived from the features described relating to the above manufacturing method may be selectively applied to this modification.

Figure 14:
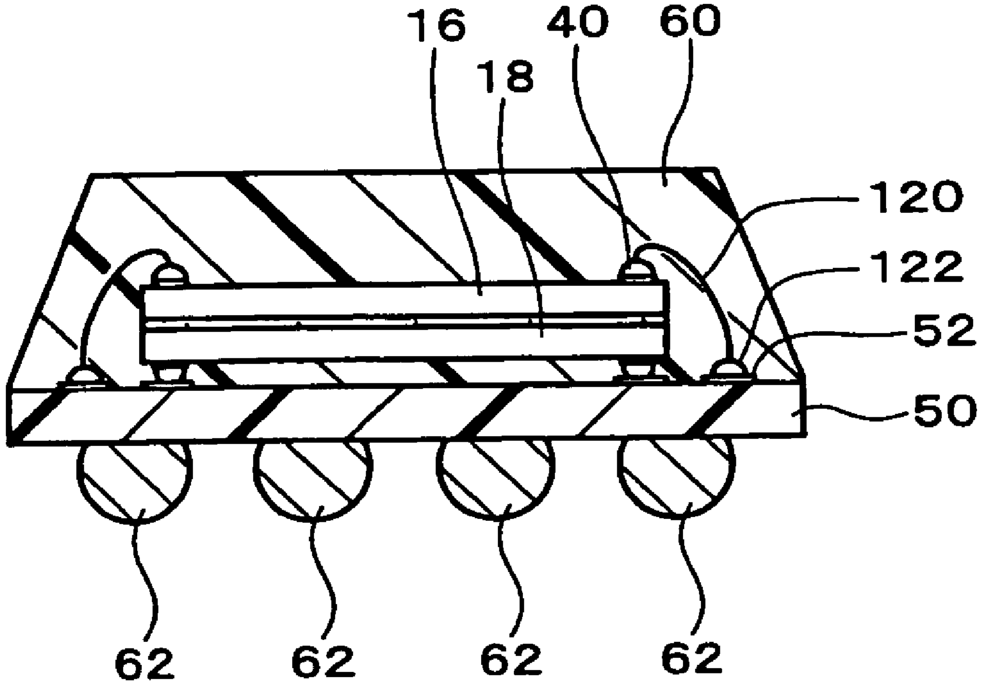
FIG. 14 further illustrates the semiconductor device according to the second embodiment of the present invention.

FIG. 14 shows an example of a semiconductor device to which the present embodiment is applied. In the example shown in FIG. 14, a semiconductor device includes a plurality of semiconductor chips 16 and 18, the substrate 50 having the electrodes 52, a sealing section 60, and external terminals 62. The semiconductor device according to the present embodiment is not limited to the following example.

Interconnects are formed on the substrate 50. A part of the interconnects is the electrodes 52. A plurality of semiconductor chips 16 and 18 are stacked on the substrate 50. In more detail, the semiconductor chip 18 is bonded face down to the substrate 50, and the semiconductor chip 16 is disposed on the semiconductor chip 18. The semiconductor chip 16 is disposed so that the side of the semiconductor chip 16 having the electrodes 12 faces opposite to the semiconductor chip 18. Therefore, the semiconductor chip 16 can be electrically connected with the substrate 50 through the wires 120. In more detail, the bumps 40 are provided on the semiconductor chip 16, and electrically connected with the electrodes 52 of the substrate 50 through the wires 120. The connection structure through the wires 120 is the same as described above.

The sealing section 60 is generally formed of a resin (epoxy resin, for example). A plurality of external terminals (solder balls, for example) 62 are provided on the substrate 50. The external terminals 62 are electrically connected with the interconnects of the substrate 50. The external terminals 62 are provided on the side of the substrate 50 opposite to the side on which a plurality of semiconductor chips 16 and 18 are mounted through through holes (not shown) formed in the substrate 50, for example.

According to the semiconductor device of the present embodiment, a device capable of achieving a decrease in loop height of the wire 120 and ensuring highly reliable electrical connection can be provided.

Any of the subjects (configuration, action, and effect) derived from the features described relating to the above manufacturing method may be selectively applied to the semiconductor device according to the present embodiment. For example, the present embodiment maybe applied to the case where the substrate 50 is replaced with another semiconductor chip.

Third Embodiment

FIGS. 15A to 20 are views showing a semiconductor device and a method of manufacturing the same according to the present embodiment. In the present embodiment, first bonding of another wire 220 to the bump 40 to which the wire 120 is bonded is performed.

The following example includes the manufacturing method described in the above embodiment. The features of the present embodiment may be applied after performing a step different from the above embodiment (common wire bonding step, for example).

Figure 15B:
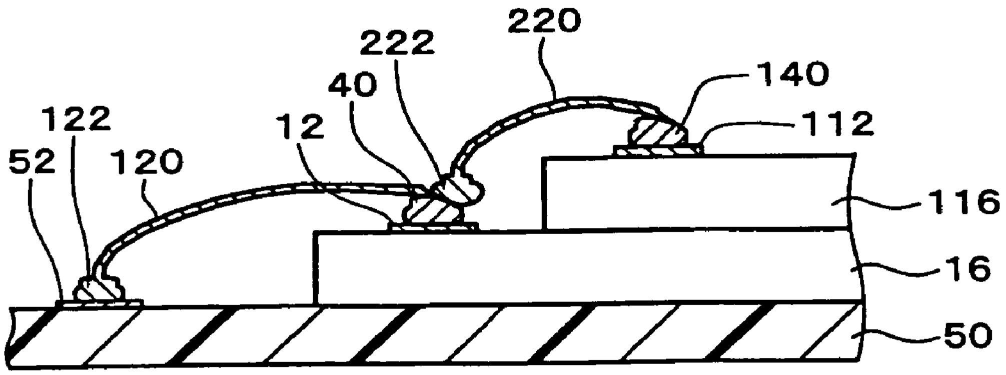
Figure 16:
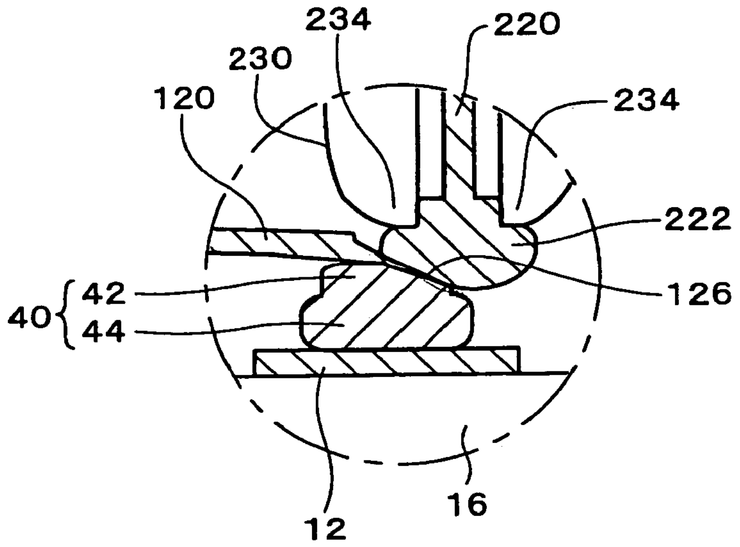
FIG. 16 is a partially enlarged view of FIG. 15A.
Figure 17:
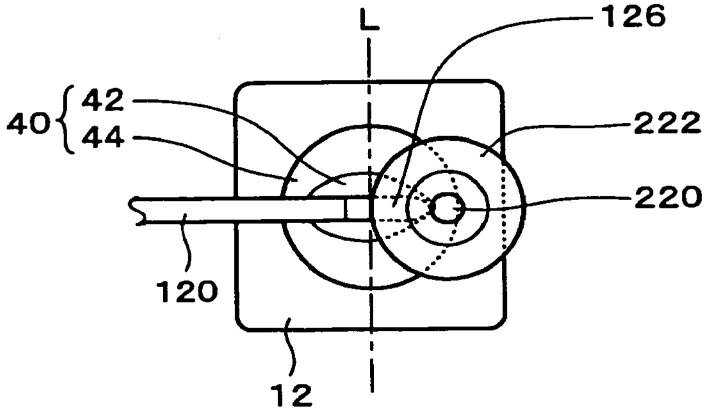
FIG. 17 further illustrates the semiconductor device and the method of manufacturing a semiconductor device according to the third embodiment of the present invention.
Figure 18:
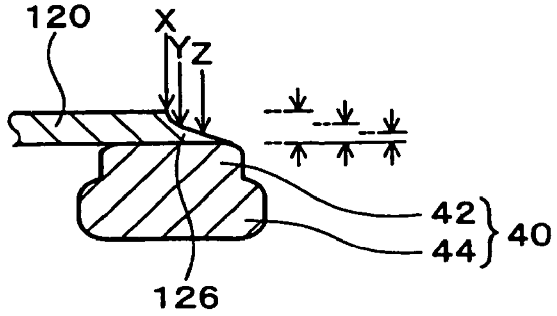
FIG. 18 further illustrates the semiconductor device and the method of manufacturing a semiconductor device according to the third embodiment of the present invention.

FIGS. 15A and 15B are views showing a bonding step of the wire. FIG. 16 is a partially enlarged view of FIG. 15A. FIG. 17 is a plan view of a connection structure shown in FIG. 16. In FIG. 17, illustration of the tool is omitted. FIG. 18 illustrates a contact area with the wire.

As shown in FIG. 15A, another electrode 112 is provided in addition to the form shown in FIG. 11 described in the above embodiment. In the example shown in FIG. 15A, a plurality of semiconductor chips 16 and 116 are stacked on the substrate 50 so that the electrodes 52, 12, and 112 are exposed. The semiconductor chip 116 is mounted on the semiconductor chip 16. In this case, the external shape of the semiconductor chip 116 on the top is generally smaller than the external shape of the semiconductor chip 16 on the bottom.

As shown in FIG. 15A, a tool 230 which supports the wire 220 is provided. The tip 222 of the wire 220 is formed in the shape of a ball. The wire 220, the tool 230, and a damper 236 may be the same as described above. The tool 230 has a hole 232 and an open end 234. The method of forming the tip 222 of the wire 220 in the shape of a ball is also the same as described above.

The tip 222 of the wire 220 is bonded to the bump 40 by using the open end 234 of the tool 230. In this case, the tip 222 is bonded to the bump 40 in a state in which at least a part of the tip 222 overlaps the wire 120, as shown in FIGS. 16 and 17. This enables the planar area of the bump 40 to be effectively utilized. It is preferable to bond the tip 222 to the bump 40 while applying ultrasonic vibration.

As shown in FIG. 16, the above bonding step is performed so that the undeformed portion of the wire 120 connected with the bump 40 is not deformed by the tip 222 of the wire 220 and the tool 230. In this case, it is preferable to prevent the tip 222 of the wire 220 and the tool 230 from coming in contact with the undeformed portion of the wire 120. The undeformed portion of the wire 120 refers to a part which is not deformed in the step of bonding the wire 120 to the bump 40. Specifically, a deformed portion of the wire 120 refers to the joint section 126 of the wire 120.

In the example shown in FIG. 18, the above bonding step is performed so that the tip 222 of the wire 220 and the tool 230 do not come in contact with a part of the wire 120 which is less deformed than a point X (on the left side of the point X). The point X shown in FIG. 18 is a boundary point of the region of the wire 120 deformed when bonding the wire 120 to the bump 40.

This prevents the shape of loop of the wire 120 connected with the bump 40 from being changed. In more detail, the wire 120 can be prevented from coming in contact with the semiconductor chip 16 due to a decrease in loop height of the wire 120, from collapsing sideways, or from being damaged.

The tip 222 of the wire 220 and the tool 230 maybe prevented from coming in contact with a part of the wire 120 which is less deformed than a point Y shown in FIG. 18 (on the left side of the point Y) The point Y shown in FIG. 18 is a boundary point at which the diameter (thickness) of the wire 120 is almost halved. This enables the above effects to be achieved more reliably.

The tip 222 of the wire 220 and the tool 230 maybe prevented from coming in contact with a part of the wire 120 which is less deformed than a point Z shown in FIG. 18 (on the left side of the point Z). The point Z shown in FIG. 18 is a boundary point at which the diameter (thickness) of the wire 120 decreases to almost one third the original diameter. This enables the above effects to be achieved still more reliably.

As shown in FIG. 17, the bonding step may be performed in a state in which the center of the tip 222 of the wire 220 (part of the wire 220 continuous from the tip 222 to the hole 232 in FIG. 17) is disposed on a part of the bump 40 beyond the center in the drawing direction of the wire 120 (on the right side of the center line L shown in FIG. 17). Specifically, the center of the tip 222 may be shifted in the drawing direction of the wire 120 toward the bump 40. In this case, if the width of the bump 40 (top end 42, in particular) is elongated in the drawing of the wire 120, a junction region between the wire 120 and the bump 40 can be secured sufficiently. The form of increasing the width of the bump 40 is the same as described in the first and second embodiments. Moreover, if the height of the bump 40 decreases along the drawing direction of the wire 120, the tip 222 of the wire 220 can be easily placed on the bump 40. The form of sloping the bump 40 is the same as described in the first and second embodiments. These features enable the tip 222 of the wire 220 to be bonded to the bump 40 in a reliable and stable state.

As shown in FIG. 17, the entire tip 222 may be disposed on a part of the bump 40 beyond the center of the bump 40 in the drawing direction of the wire 120 (part on the right side of the center line L in FIG. 17), or disposed to include the center of the bump 40 in the drawing direction of the wire 120 (part which overlaps the center line L in FIG. 17). The tip 222 of the wire 220 may be bonded to the bump 40 in a state in which a part of the tip 222 overlaps a part of the bump 40 as shown in FIG. 17, or the entire tip 222 overlaps a part of the bump 40.

As shown in FIG. 15B, the wire 220 is electrically connected with the electrode 112 after the above bonding step. In more detail, a bump 140 is formed on the electrode 112 in advance. The wire 220 is drawn toward the bump 140, and a part of the wire 220 is bonded to the bump 140. If the bump 140 is the same as the bump 40, the effects described in the second embodiment can be achieved in the bonding step of the wire 220 to the bump 140.

According to the method of manufacturing a semiconductor device of the present embodiment, since the bonding step is performed so that the undeformed portion of the wire 120 is not deformed by the tip 222 of the wire 220 and the tool 230, another wire 220 can be bonded to the bump 40 without causing connection failure between the wire 120 and the bump 40.

Any of the subjects (configuration, action, and effect) derived from the features described relating to the above manufacturing method may be selectively applied to the method of manufacturing a semiconductor device according to the present embodiment.

Figure 19:
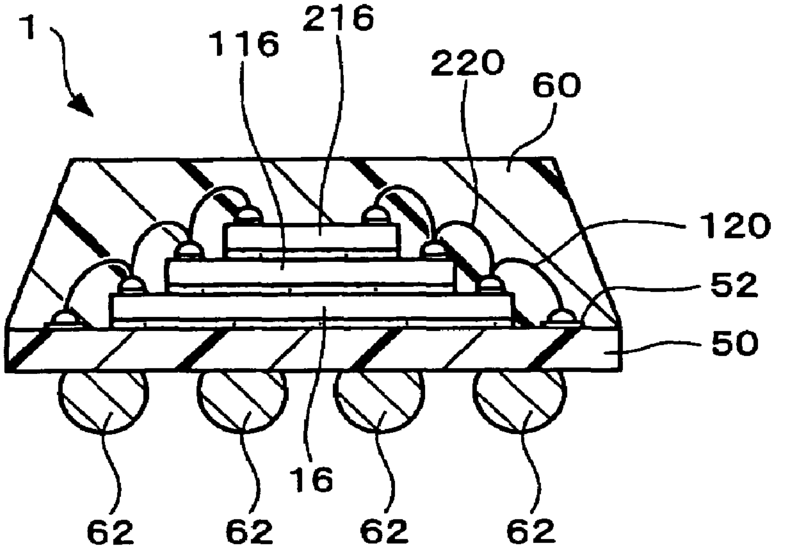
FIG. 19 further illustrates the semiconductor device according to the third embodiment of the present invention.

FIG. 19 shows an example of a semiconductor device to which the present embodiment is applied. In the example shown in FIG. 19, the semiconductor device includes a plurality of semiconductor chips 16, 116, and 216, the substrate 50 having the electrodes 52, the sealing section 60, and the external terminals 62. The substrate 50, the sealing section 60, and the external terminals 62 are the same as described above. The semiconductor device according to the present embodiment is not limited to the following example.

A plurality of semiconductor chips 16, 116, and 216 are stacked on the substrate 50. In more detail, the semiconductor chip 16 is bonded face down to the substrate 50. The semiconductor chip 116 is disposed on the semiconductor chip 16. The semiconductor chip 216 is disposed on the semiconductor chip 116. Each of the semiconductor chips 16, 116, and 216 is disposed so that the side having the electrodes faces opposite to the substrate 50. Therefore, the semiconductor chips 16, 116, and 216 can be electrically connected with the substrate 50 through the wires 120 and 220. The connection structure through the wires 120 and 220 is the same as described above.

According to the semiconductor device of the present embodiment, a device capable of achieving a decrease in loop height of the wires 120 and 220 and ensuring highly reliable electrical connection can be provided.

Figure 20:
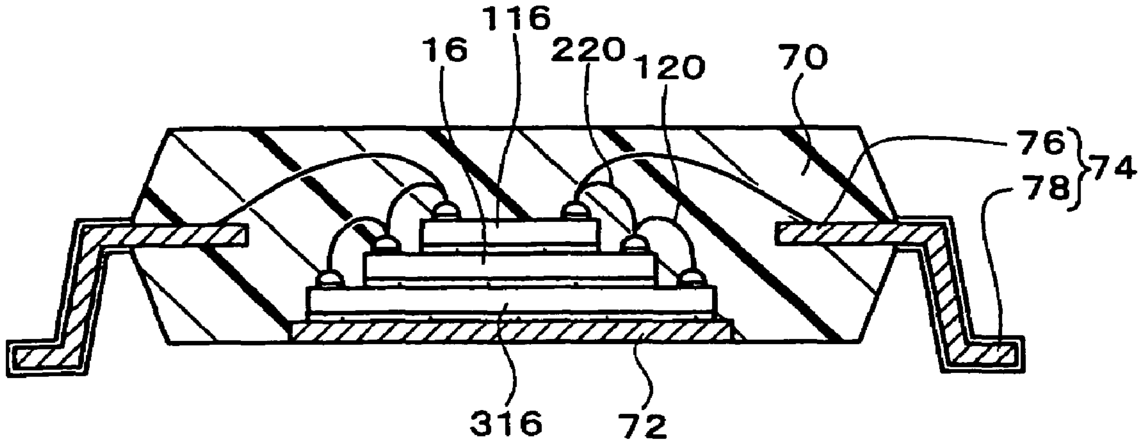
FIG. 20 further illustrates the semiconductor device according to the third embodiment of the present invention.

FIG. 20 shows another example of a semiconductor device to which the present embodiment is applied. In the example shown in FIG. 20, a semiconductor device includes a plurality of semiconductor chips 16, 116, and 316, a sealing section 70, a die pad 72 on which the semiconductor chips are mounted, and leads 74. This semiconductor device has a Quad Flat Package (QFP) type package structure.

A plurality of semiconductor chips 16, 116, and 316 are placed on one side of the die pad 72. The other side of the die pad 72 is exposed from the sealing section 70. This enables radiation properties of the semiconductor device to be improved. The sealing section 70 is generally formed of an epoxy resin. Each of the leads 74 includes an inner lead 76 electrically connected with one of the semiconductor chips (semiconductor chip 116 in FIG. 20) inside the sealing section 70, and an outer lead 78 which projects outside the sealing section 70. The outer lead 78 is bent in a specific shape (gull-wing shape in FIG. 20), and becomes an external terminal of the semiconductor device. As shown in FIG. 20, a metal film (plated film, for example) such as a brazing material is provided to the outer leads 78. The semiconductor chips 16, 116, and 316 are electrically connected with one another through the wires 120 and 220. The connection structure through the wires is the same as described above.

According to the semiconductor device of the present embodiment, a device capable of achieving a decrease in loop height of the wires 120 and 220 and ensuring highly reliable electrical connection can be provided.

Figure 21:
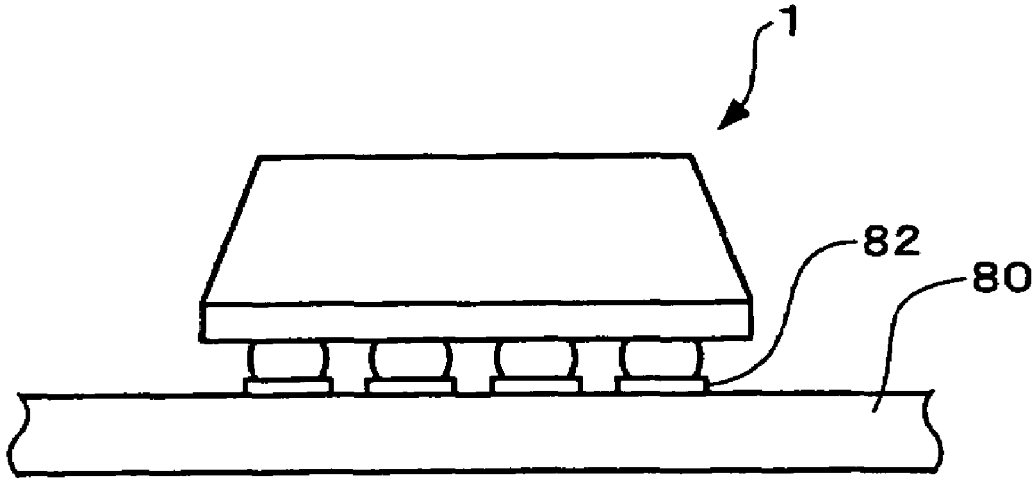
FIG. 21 shows a circuit board according to an embodiment of the present invention.

FIG. 21 shows a circuit board to which the above embodiment is applied. The semiconductor device 1 shown in FIG. 19 is mounted on a circuit board 80. As the circuit board 80, an organic substrate such as a glass epoxy substrate is generally used. An interconnection pattern 82 is formed of copper or the like on the circuit board 80 so that a desired circuit is formed. The interconnection pattern 82 is joined to the external terminals of the semiconductor device.

Figure 22:
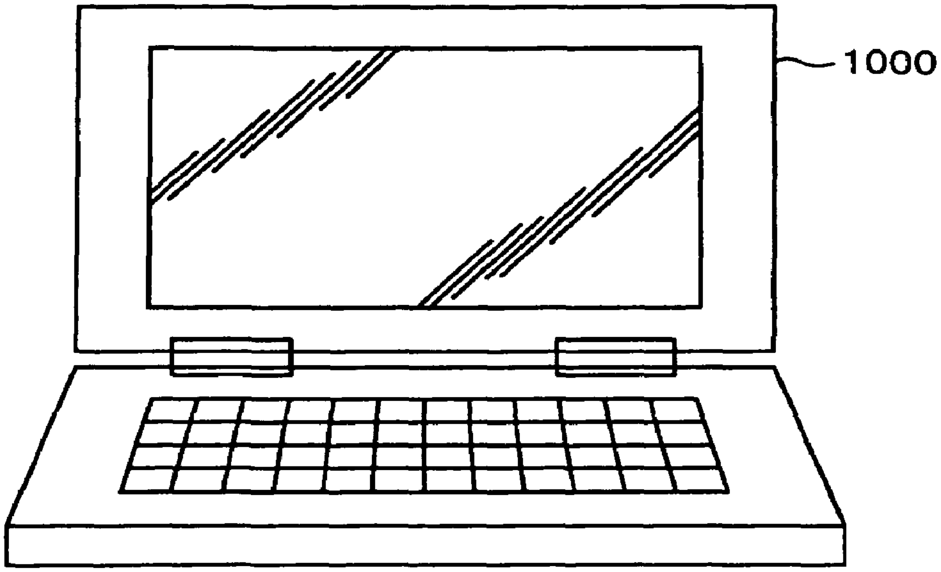
FIG. 22 shows electronic equipment according to an embodiment of the present invention.
Figure 23:
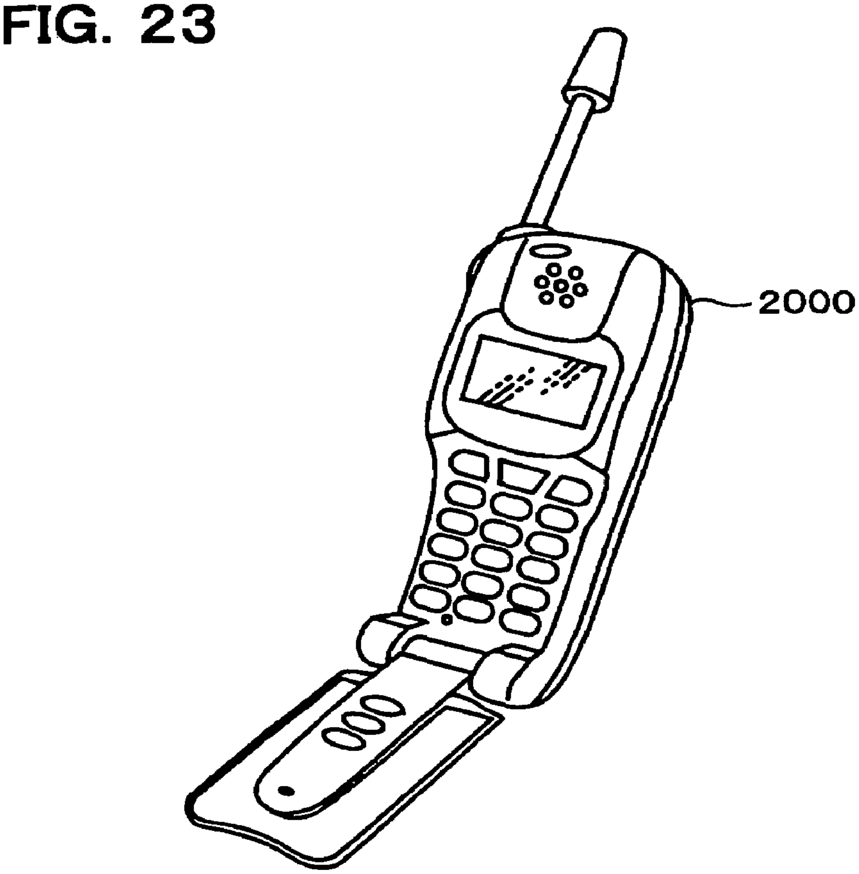
FIG. 23 further shows electronic equipment according to an embodiment of the present invention.

FIGS. 22 and 23 respectively show a notebook-type personal computer 1000 and a portable telephone 2000 as examples of electronic equipment including the semiconductor device according to the embodiment of the present invention.

The present invention is not limited to the above-described embodiments. Various modifications and variations are possible. For example, the present invention includes configurations essentially the same as the configurations described in the embodiments (for example, configurations having the same function, method, and results, or configurations having the same object and results). The present invention includes configurations in which any unessential part of the configuration described in the embodiments is replaced. The present invention includes configurations having the same effects or achieving the same object as the configurations described in the embodiments. The present invention includes configurations in which conventional technology is added to the configurations described in the embodiments.

What is claimed is:

1. A method of manufacturing a semiconductor device, comprising:

(a) bonding a first tip of a first wire to a first electrode;

(b) drawing the first wire from the first electrode to a bump on a second electrode;

(c) bonding the first wire to the bump with a first part of the first wire deformed; and (d) bonding a second tip of a second wire formed in a shape of a ball to the bump in a state in which at least a part of the second tip of the second wire is superposed on the first wire without deforming a second part of the first wire that is all of a remaining part of the first wire other than the first part.

2. The method of manufacturing a semiconductor device as defined by claim 1, the bonding step being performed in a state in which a center of the second tip of the second wire is disposed on a portion of the bump beyond the center of the bump along a drawing direction of the first wire in the step (d).

3. The method of manufacturing a semiconductor device as defined by claim 1, the bonding step being performed without causing the second tip of the second wire and a tool to come in contact with the second part of the first wire excluding the first part of the first wire that is deformed so that a diameter of the first part of the first wire is decreased to about half or less in the step (d).

4. The method of manufacturing a semiconductor device as defined by claim 1, the bonding step being performed without causing the second tip of the second wire and a tool to come in contact with the second part of the first wire excluding the first part of the first wire that is deformed so that a diameter of the first part of the first wire is decreased to about a third or less in the step (d).

5. The method of manufacturing a semiconductor device as defined by claim 1, further comprising:

a step of forming another bump on a third electrode, the second wire being drawn from the second electrode to the bump on the third electrode and bonded to the bump on the third electrode after the step (d).

6. The method of manufacturing a semiconductor device as defined by claim 1, further comprising:

a tool having a hole into which the second wire is inserted, and the bonding step being performed by using an open end of a tool in the step (d).

7. The method of manufacturing a semiconductor device as defined by claim 1, the first wire being bonded to a center of the bump or a portion of the bump beyond the center along a drawing direction of the first wire in the step (c).

8. The method of manufacturing a semiconductor device as defined by claim 1, a part of the bump being deformed in the step (c).

9. The method of manufacturing a semiconductor device as defined by claim 1, the bump being formed so that a width of the bump is elongated in a drawing direction of the first wire in the step (c).

10. The method of manufacturing a semiconductor device as defined by claim 1, the bump being formed so that a height of the bump decreases as a distance from the first wire increases in a drawing direction of the first wire in the step (c).

11. The method of manufacturing a semiconductor device as defined by claim 10, further comprising:

a tool having a hole into which the second wire is inserted, and the bonding step being performed by using an open end of the tool in the step (d).

12. The method of manufacturing a semiconductor device as defined by claim 1, further comprising, before the step (a):

(e) bonding a third tip of a third wire formed in a shape of a ball to the second electrode;

(f) drawing a part of the third wire from the third tip bonded to the second electrode;

(g) forming the bump on the second electrode by deforming a portion of the third wire continuously connected to the third tip of the third wire on the third tip, and (h) cutting the third wire while leaving the bump on the second electrode.

13. The method of manufacturing a semiconductor device as defined by claim 12, the bump being formed to have a bottom end connected with the second electrode and a top end having an almost smooth surface in the step (g).

14. The method of manufacturing a semiconductor device as defined by claim 13, the top end of the bump being formed so that a width of the top end is elongated in a drawing direction of the first wire connected with the bump toward the bump in the step (g).

15. The method of manufacturing a semiconductor device as defined by claim 13, the top end of the bump being formed so that a height of the top end decreases as a distance from the first wire increases in a drawing direction of the first wire in the step (g).

16. A semiconductor device manufactured by using a method comprising:

(a) bonding a first tip of a first wire to a first electrode;

(b) drawing the first wire from the first electrode to a bump on a second electrode;

(c) bonding the first wire to the bump with a first part of the first wire deformed; and (d) bonding a second tip of a second wire formed in a shape of a ball to the bump in a state in which at least a part of the second tip of the second wire is superposed on the first wire without deforming a second part of the first wire that is all of a remaining part of the first wire other than the first part.

17. A circuit board having a semiconductor device mounted on the circuit board, the semiconductor device being manufactured by using a method comprising:

(a) bonding a first tip of a first wire to a first electrode;

(b) drawing the first wire from the first electrode to a bump on a second electrode;

(c) bonding the first wire to the bump with a first part of the first wire deformed; and (d) bonding a second tip of a second wire formed in a shape of a ball to the bump in a state in which at least a part of the second tip of the second wire is superposed on the first wire without deforming a second part of the first wire that is all of a remaining part of the first wire other than the first part.

18. Electronic equipment having a semiconductor device manufactured by using a method comprising:

(a) bonding a first tip of a first wire to a first electrode;

(b) drawing the first wire from the first electrode to a bump on a second electrode;

(c) bonding the first wire to the bump with a first part of the first wire deformed; and (d) bonding a second tip of a second wire formed in a shape of a ball to the bump in a state in which at least a part of the second tip of the second wire is superposed on the first wire without deforming a second part of the first wire that is all of a remaining part of the first wire other than the first part.

19. A method of manufacturing a semiconductor device, comprising:

(a) bonding a first tip of a first wire to a first electrode;

(b) drawing the first wire from the first electrode to a bump on a second electrode;

(c) bonding a part of the first wire to the bump by deforming the part of the first wire; and (d) bonding a second tip of a second wire formed in a shape of a ball to the bump, in a state in which at least a part of the second tip of the second wire is superposed on the first wire with the second tip of the second wire avoiding a center of the bump.

20. A semiconductor device manufactured by using a method comprising:

(a) bonding a first tip of a first wire to a first electrode;

(b) drawing the first wire from the first electrode to a bump on a second electrode;

(c) bonding a part of the first wire to the bump by deforming the part of the first wire; and (d) bonding a second tip of a second wire formed in a shape of a ball to the bump, in a state in which at least a part of the second tip of the second wire is superposed on the first wire with the second tip of the second wire avoiding a center of the bump.

21. A circuit board having a semiconductor device mounted on the circuit board, the semiconductor device being manufactured by using a method comprising:

(a) bonding a first tip of a first wire to a first electrode;

(b) drawing the first wire from the first electrode to a bump on a second electrode;

(c) bonding a part of the first wire to the bump by deforming the part of the first wire; and (d) bonding a second tip of a second wire formed in a shape of a ball to the bump, in a state in which at least a part of the second tip of the second wire is superposed on the first wire with the second tip of the second wire avoiding a center of the bump.

22. Electronic equipment having a semiconductor device manufactured by using a method comprising:

(a) bonding a first tip of a first wire to a first electrode;

(b) drawing the first wire from the first electrode to a bump on a second electrode;

(c) bonding a part of the first wire to the bump by deforming the part of the first wire; and (d) bonding a second tip of a second wire formed in a shape of a ball to the bump, in a state in which at least a part of the second tip of the second wire is superposed on the first wire with the second tip of the second wire avoiding a center of the bump.

* * * * *